(12) United States Patent
Park et al.

(10) Patent No.: US 11,016,393 B2
(45) Date of Patent: May 25, 2021

(54) DISPLAY APPARATUS

(71) Applicant: SAMSUNG ELECTRONICS CO., LTD., Suwon-si (KR)

(72) Inventors: Yoonki Park, Suwon-si (KR); Mijeong Song, Suwon-si (KR); Valeriy Prushinskiy, Suwon-si (KR); Dohyeon Baek, Suwon-si (KR); Seungjae Lee, Suwon-si (KR); Byoungjin Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/588,274

(22) Filed: Sep. 30, 2019

(65) Prior Publication Data

US 2020/0159127 A1 May 21, 2020

(30) Foreign Application Priority Data

Nov. 20, 2018 (KR) .......................... 10-2018-0143790

(51) Int. Cl.
*G02B 6/00* (2006.01)
*G02B 7/00* (2021.01)
(Continued)

(52) U.S. Cl.
CPC ........... *G03F 7/70341* (2013.01); *G02B 1/14* (2015.01); *G03F 7/70875* (2013.01); *G03F 7/70958* (2013.01); *G03F 7/70983* (2013.01)

(58) Field of Classification Search
CPC ............. G02F 1/13337; G02F 1/13306; G02F 1/13318; G02F 1/13305; G02F 2201/122;
(Continued)

(56) References Cited

U.S. PATENT DOCUMENTS

2010/0302717 A1* 12/2010 Oh .................... G02F 1/133308
361/679.01
2015/0219838 A1* 8/2015 Jang ..................... G02B 6/0088
349/65

(Continued)

FOREIGN PATENT DOCUMENTS

JP 2005-276718 A 10/2005
JP 2008-58709 A 3/2008
(Continued)

OTHER PUBLICATIONS

Written Opinion (PCT/ISA/237) issued by the International Searching Authority in corresponding International Application No. PCT/KR2019/011131, dated Dec. 18, 2019.
(Continued)

*Primary Examiner* — Mesfin T Asfaw
(74) *Attorney, Agent, or Firm* — Sughrue Mion, PLLC

(57) ABSTRACT

A display apparatus is provided. The display apparatus may include a display panel, an optical member that is disposed behind the display panel and that is configured to guide light to the display panel, a light source that is configured to irradiate light to the optical member, a holder that is configured to support the display panel and the optical member, and a contraction member that is disposed parallel to the optical member, and that comprises a negative thermal expansion (NTE) substance.

15 Claims, 11 Drawing Sheets

(51) Int. Cl.
*G03F 7/20* (2006.01)
*G02B 1/14* (2015.01)

(58) Field of Classification Search
CPC .. G02F 2201/50; G02F 1/13; G02F 1/133308; G02F 1/133371; G02F 1/1334; G02F 1/1335; G02F 1/133509; G02F 1/133615; G02F 1/13781; G02F 1/163; G02F 2001/13332; G02F 2001/133325; G02F 2001/133354; G02F 2001/133388; G02F 2001/133397; G02F 2001/133616; G02F 2001/13396; G02F 2001/13398; G02F 2001/136295; G02F 2001/13775; G02F 2201/40; G02F 2201/44; G02F 2201/52; G02F 2203/62; G02F 1/133608; G02F 1/133603; G02F 1/133604; G02F 1/1336; G02F 1/1337; G02B 6/0088; G02B 6/0091; G02B 1/14; G02B 7/008; G03F 7/70341; G03F 7/70983; G03F 7/70958; G03F 7/70875
See application file for complete search history.

(56) References Cited

U.S. PATENT DOCUMENTS

| | | |
|---|---|---|
| 2015/0316710 A1 | 11/2015 | Liu |
| 2018/0081392 A1 | 3/2018 | Kweon et al. |
| 2018/0149800 A1* | 5/2018 | Kim .............. G02B 6/0055 |

FOREIGN PATENT DOCUMENTS

| | | |
|---|---|---|
| JP | 4143037 B2 | 9/2008 |
| KR | 10-0914392 B1 | 8/2009 |
| KR | 10-2013-0030361 A | 3/2013 |
| KR | 10-2014-0043631 A | 4/2014 |
| KR | 10-1721663 B1 | 3/2017 |
| KR | 10-2018-0060291 A | 6/2018 |

OTHER PUBLICATIONS

International Search Report (PCT/ISA/210), issued by International Searching Authority in corresponding International Application No. PCT/KR2019/011131, dated Dec. 18, 2019.

* cited by examiner

DISPLAY APPARATUS

CROSS-REFERENCE TO RELATED APPLICATION(S)

This application is based on and claims priority under 35 U.S.C. § 119 to Korean Patent Application No. 10-2018-0143790, filed on Nov. 20, 2018, in the Korean Intellectual Property Office, the disclosure of which is incorporated by reference herein in its entirety.

BACKGROUND

1. Field

The disclosure relates to a display apparatus which reduces structural deformation due to temperature variation, and which improves structural stability.

2. Description of Related Art

A display apparatus is an apparatus that displays images by using a display panel, and includes a television, a computer monitor, a smartphone, and the like. However, a general display apparatus typically cannot emit light by itself, and typically might include a separate light source.

A light source emits heat as the light source irradiates light for implementing an image of a display apparatus. Accordingly, an optical member that is disposed adjacent to the light source might expand in volume as the temperature rises due to heat transmitted from the light source.

Accordingly, an optical member might become bent or distorted due to a structure that fixes an optical member at the corner. Accordingly, optical sway might occur on a display screen, and/or luminance might not be uniform.

SUMMARY

Provided is a display apparatus which reduces structural deformation due to temperature variation, and that improves structural stability.

Provided is a display panel, an optical member that is disposed behind the display panel and that is configured to guide light to the display panel, a light source that is configured to irradiate light to the optical member, a holder that is configured to support the display panel and the optical member, and a contraction member that is disposed parallel to the optical member, and that comprises a negative thermal expansion (NTE) substance.

The optical member may include a plurality of connection holes formed at predetermined intervals in a corner area of the optical member, and the display apparatus may include connection members that are configured to be inserted in the plurality of connection holes, and that are configured to connect the optical member and the contraction member.

A surface of the contraction member is affixed to the holder, and the plurality of connection members may include a plurality of insertion parts that are configured to be inserted in the plurality of connection holes, and a plurality of connection parts that are configured to connect the contraction member and the plurality of insertion parts.

A separation space may be formed between the contraction member and the optical member.

The optical member may include a rectangular light guide plate, the light source is disposed along a first side surface of the optical member, and the contraction member is disposed along a second side surface of the optical member that is different from the first side surface.

The display apparatus may further include another contraction member that is disposed on a third side surface that opposes the second side surface.

The first side surface may be a lower side surface of the optical member, the second side surface may be a left side surface of the optical member, and the third side surface may be a right side surface of the optical member.

The holder may include an accommodation part that is configured to accommodate the contraction member.

The holder may include a left side holder that is configured to support a left side portion of the optical member, and a right side holder that is configured to support a right side portion of the optical member, and the contraction member may be accommodated in the left side holder, and the other contraction member may be accommodated in the right side holder.

The plurality of connection holes may be formed along the second side surface and the third side surface.

Also, the plurality of connection holes may be formed only in respective upper areas of the second side surface and the third side surface of the optical member.

The optical member may include at least one of a light guide plate, a diffusion plate, a reflective sheet, a prism sheet, a protective sheet, a double brightness enhancement film (DBEF), and a color sheet.

The light source may be disposed behind the optical member, the display apparatus may include a plurality of contraction members, and the plurality of contraction members may be respectively disposed along side surfaces of the optical member.

The optical member may include at least one among a diffusion plate, a reflective sheet, a prism sheet, a protective sheet, a double brightness enhancement film (DBEF), and a color sheet.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Hereinafter, embodiments of the disclosure will be described with reference to the accompanying drawings. Meanwhile, it should be noted that the disclosure is not limited to the embodiments described herein, that the disclosure may be implemented in various forms, and that various modifications may be made to the embodiments of the disclosure. The descriptions of the embodiments of the disclosure are provided to provide a person having ordinary skill in the art to which the disclosure belongs to fully understand the range of the invention. Meanwhile, in the accompanying drawings, components might be shown in an enlarged manner than as compared their actual size in practice for the convenience of description, and the proportion of each component may be exaggerated or reduced.

In a case where it is described that a component is "on top of" or "contacts" another component, it should be understood that a component may directly contact or be connected with the top portion of another component. Alternatively, another component may be provided between the components. In contrast, in a case where it is described that a component is "just on top of" or "directly contacts" another component, it should be understood that another component is not provided between the components. Other expressions describing relations between components, for instance, such as "between ~" and "directly between ~" may be interpreted in the same manner.

Further, the expressions "first," "second," and the like, used in the disclosure may be used to describe various elements, but are not intended to limit the elements. Such terms are used to distinguish one element from another element. For example, a first element may be referred to as a second element, and a second element may be referred to as a first element in a similar manner, without departing from the scope of the disclosure.

Also, singular expressions may include plural expressions, unless defined differently in the context. In addition, terms such as "include" and "have/has" should be construed as designating that there are such characteristics, numbers, steps, operations, elements, components, or a combination thereof, in the specification, and the terms may be interpreted to denote that one or more of other characteristics, numbers, steps, operations, elements, components, or a combination thereof, may be added.

The terms used in the embodiments of the disclosure may be interpreted to include meanings as known by persons of ordinary skill in the art, unless defined differently in the disclosure.

Figure 1:
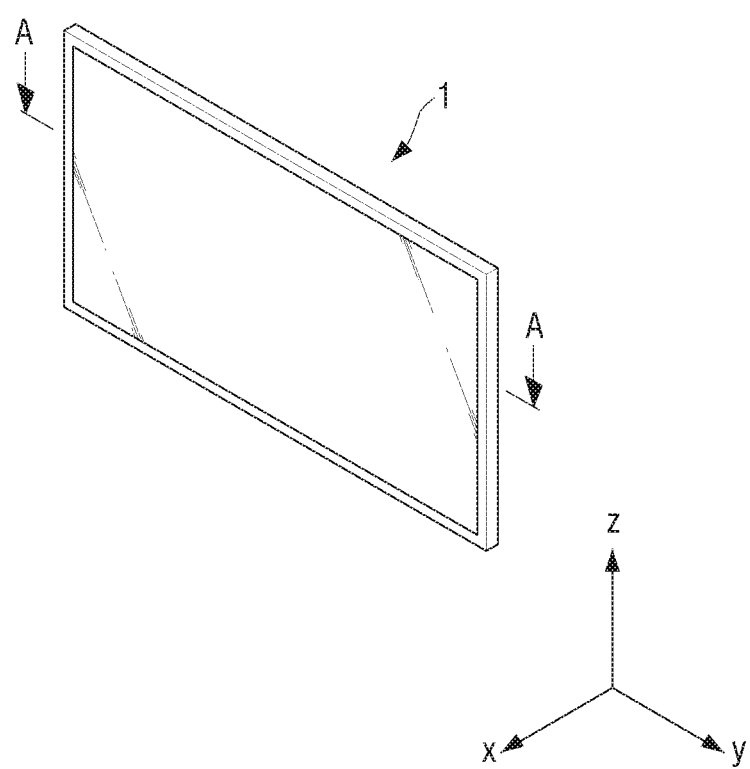
FIG. 1 is a perspective view illustrating a display apparatus according to an embodiment.
Figure 2:
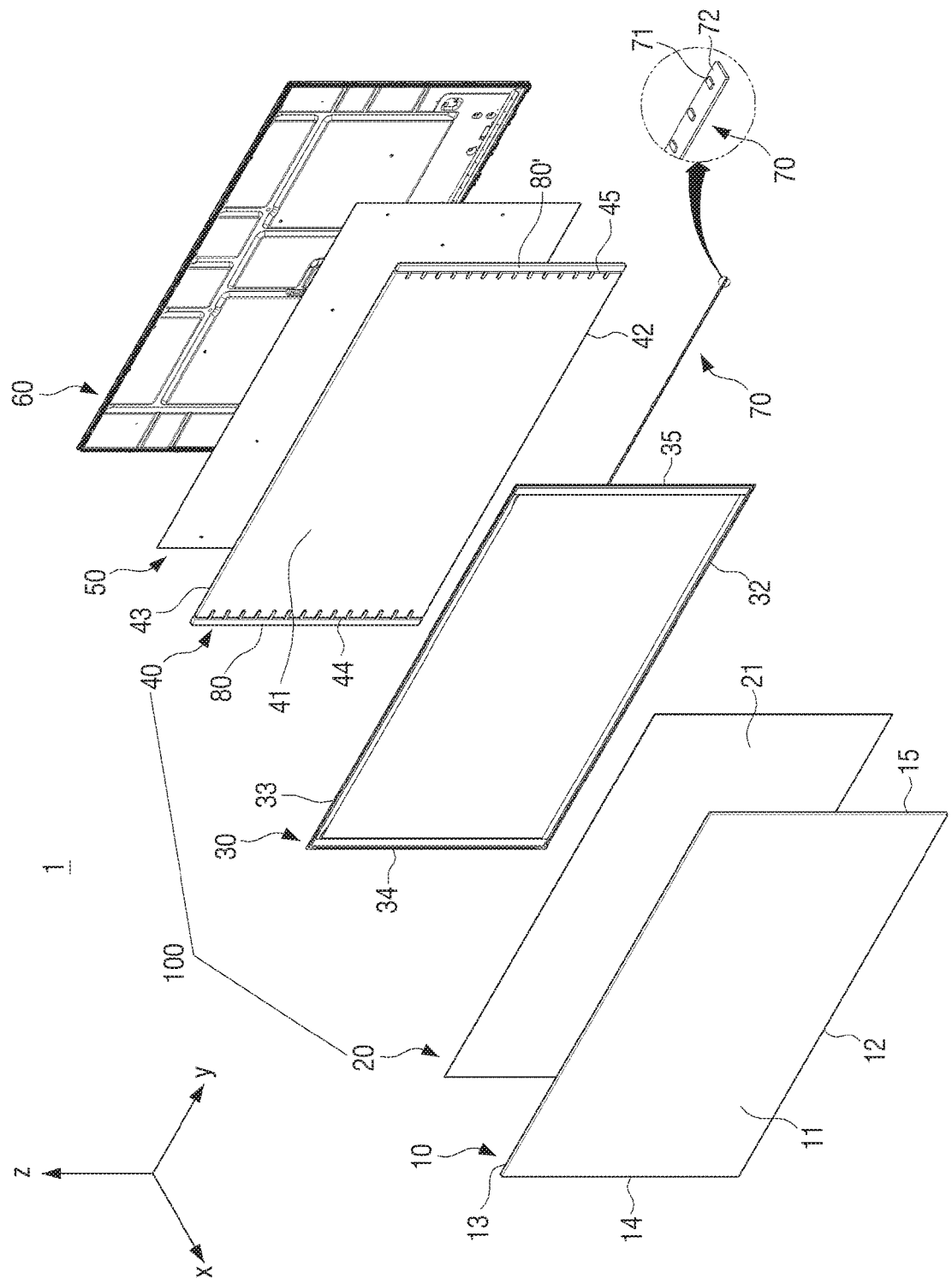
FIG. 2 is an exploded perspective view illustrating a display apparatus according to an embodiment.

FIG. 1 is a perspective view illustrating a display apparatus 1 according to an embodiment, and FIG. 2 is an exploded perspective view illustrating a display apparatus 1 according to an embodiment.

The display apparatus 1 may include a display panel 10 that is configured to display images, a diffusion plate 20, an optical member 100 that is disposed behind the display panel 10 and that is configured to guide light to the display panel 10, a light source 70 that is configured to irradiate light to the optical member 100, a holder 30 that is configured to support the display panel 10 and the optical member 100, and a contraction member 81 that is disposed parallel to the optical member 100, and includes a negative thermal expansion (NTE) substance.

The display apparatus 1 is an apparatus that is configured to process an image signal received from an external device, and visually display a processed image. The display apparatus 1 may be implemented in various forms such as a television, a monitor, a portable multimedia apparatus, a portable communication apparatus, and the like, and its forms are not limited as long as it is an apparatus that visually displays images.

The display panel 10 may display various images in a front area (e.g., the X-axis direction in FIG. 1) based on image signals received from an external device, and may include a liquid crystal display (LCD) panel.

The optical member 100 may connect with the fixing member 80, and may be a component that is configured to guide light provided from the light source 70 towards the display panel 10.

For example, the optical member 100 may include at least one among a diffusion plate 20, a light guide plate 40, a reflective sheet 50, a prism sheet (not shown), a protective sheet (not shown), a double brightness enhancement film (DBEF) (not shown), a color sheet (not shown), and the like.

Meanwhile, in reference to FIGS. 1 to 8, the disclosure may describe that the optical member 100 that is connected with the fixing member 80 is the light guide plate 40.

Figure 6A:
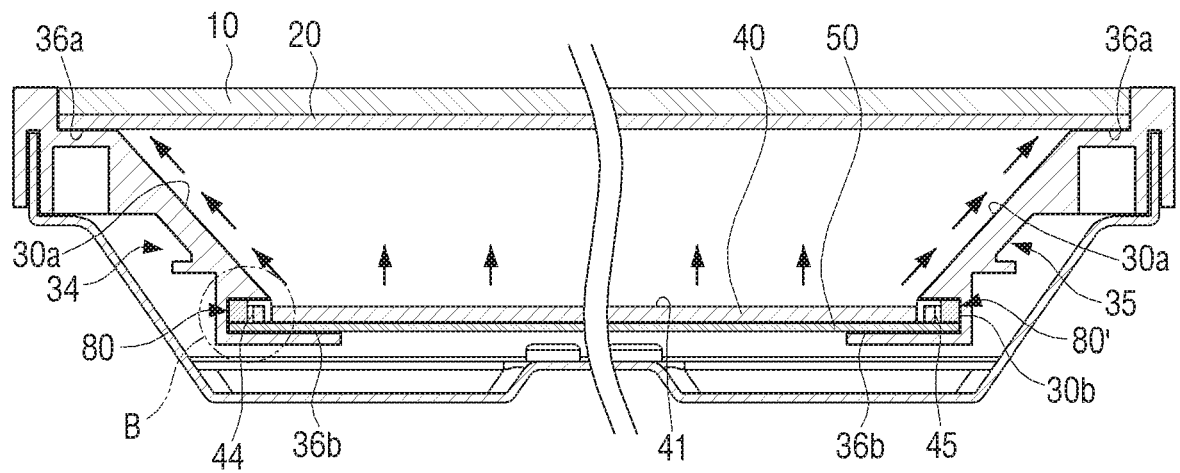
FIG. 6A is a sectional view shown along the A-A line in FIG. 1.

The display panel 10 may be laminated on the top surface 21 of the diffusion plate 20. The laminated display panel 10 and the diffusion plate 20 may be supported by a supporting part 36a (e.g., as shown in FIG. 6A) of the holder 30. In addition, the display panel 10 and the diffusion plate 20 may have larger areas than the light guide plate 40.

The diffusion plate 20 may be configured to diffuse and scatter light emitted from the top surface 41 of the light guide plate 40, and diffuse light emitted from the light guide plate 40, and thereby render the overall color and brightness of the screen displayed via the display panel 10 to seem uniform.

In addition, a prism sheet (not shown), a protective sheet (not shown), a double brightness enhancement film (DBEF) (not shown), etc., may be additionally combined to the top surface 21 or the bottom surface (a reference numeral is not given) of the diffusion plate 20.

A prism sheet and a DBEF may be configured to refract or collect light diffused through the diffusion plate 20, and thereby increase luminance, and a protective sheet may be configured to protect components disposed inside the diffusion plate 20, the prism sheet, the double brightness enhancement film, and the display apparatus 1 from external shock or foreign substances.

The light guide plate 40 may be configured to guide incident light from the light source 70 to the display panel 10, and convert the incident light from the light source 70 into a surface light source of which light quantity is uniform, and irradiate the light towards the display panel 10.

Also, the light guide plate 40 may be configured to refract, reflect, and scatter the incident light from the light source 70 internally, and thereby emit uniform light via the top surface (or the light emitting surface) 41 towards the display panel 10.

Meanwhile, the light guide plate 40 may include a rectangular shape, and may be disposed behind the display panel 10.

Figure 4:
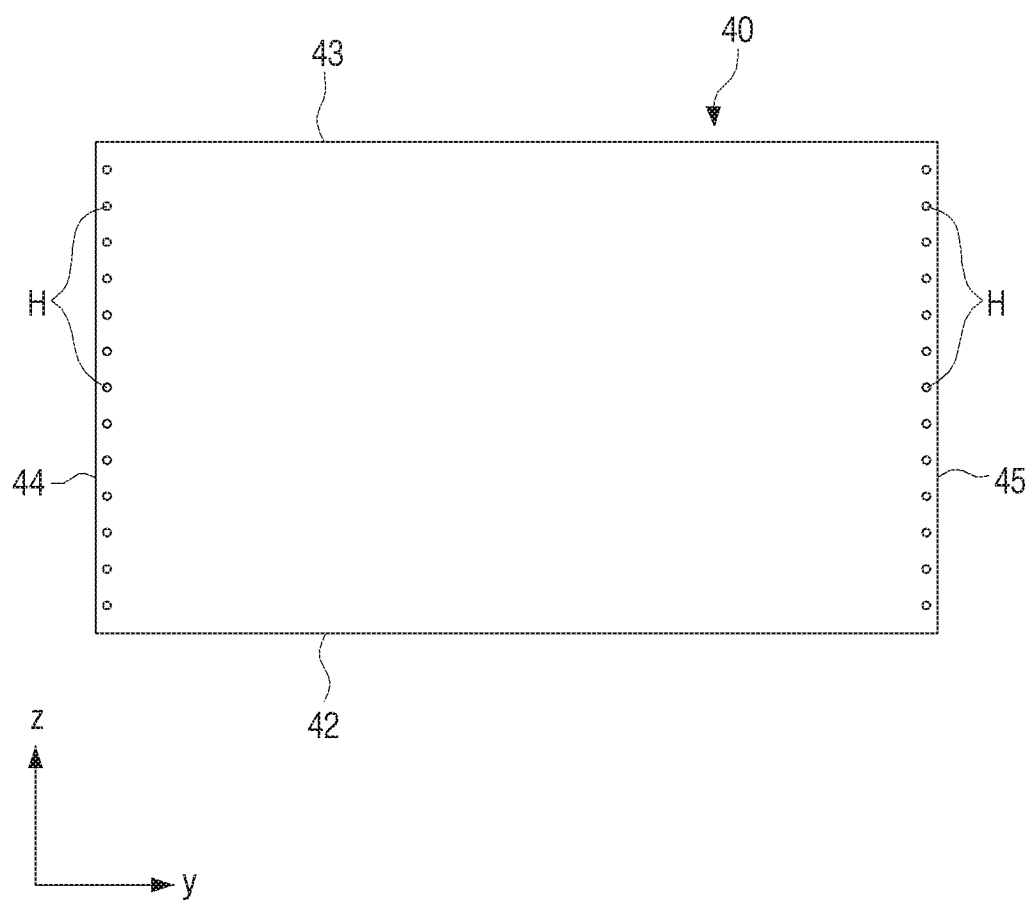
FIG. 4 is a front view illustrating an optical member according to an embodiment.

Further, the light guide plate 40 may include a plurality of connection holes H (e.g., as shown in FIG. 4) formed at predetermined intervals in the corner area of the light guide plate 40. The insertion parts 82a of the connection members 82 may be respectively inserted into the plurality of connection holes H.

Also, on the top surface 41 of the light guide plate 40, a plurality of light emission patterns (not shown) may be formed, and distribution of light irradiated through the top surface 41 may thereby become uniform.

Meanwhile, the light guide plate 40 may include poly methyl methacrylate (PMMA), polycarbonate (PC), and the like.

The light guide plate 40 may be laminated on the top surface of the reflective sheet 50. The laminated light guide plate 40 and the reflective sheet 50 may be affixed inside the holder 30 by the fixing part 36b (e.g., as shown in FIG. 6) of the holder 30.

The reflective sheet 50 may be a component that is configured to reflect light, and the reflective sheet 50 may be combined with the bottom surface of the light guide plate 40. Also, in the inside of the light guide plate 40, the reflective sheet 50 may be configured to reflect light towards the bottom surface of the light guide plate 40 to the inside of the light guide plate 40. The reflective sheet 50 may include a material that is configured to reflect light, and the reflective sheet 50 may include a polymer.

In addition, the reflective sheet 50 may have a larger area than the light guide plate 40. Accordingly, light emitted from the side surface portion at the corner of the light guide plate 40 may be reflected by the reflective sheet 50, and diffused towards the display panel 10 that is located on the upper side of the light guide plate 40.

A bottom chassis 60 is a component that may be combined with the holder 30, and the bottom chassis 60 may be configured to fix the display panel 10, the diffusion plate 20, the light guide plate 40, and the reflective sheet 50 together with the holder 30. Also, the bottom chassis 60 may be configured to fix the display apparatus 1 in a specific position by fixing the display apparatus 1 on the wall by using a separate fixing member (not shown).

The light source 70 may be disposed along a first side surface 42 of the light guide plate 40, and may be configured to output light to the display panel 10. Here, the first side surface 42 may be a lower side surface of the light guide plate 40.

The light source 70 may include a printed circuit board 72 and a plurality of light emitting diodes (LEDs) 71 disposed at predetermined intervals along the longitudinal direction of the printed circuit board 72.

The plurality of LEDs 71 may be operated by electronic signals from a control part (not shown) and an operating part (not shown).

The light source 70 may be installed on the holder 30. Specifically, the light source 70 may be accommodated inside the lower side holder 32. However, the disclosure is not limited thereto, and the light source 70 may be installed on the bottom chassis 60.

Hereinafter, the fixing member 80 according to an embodiment will be described with reference to FIG. 3.

Figure 3:
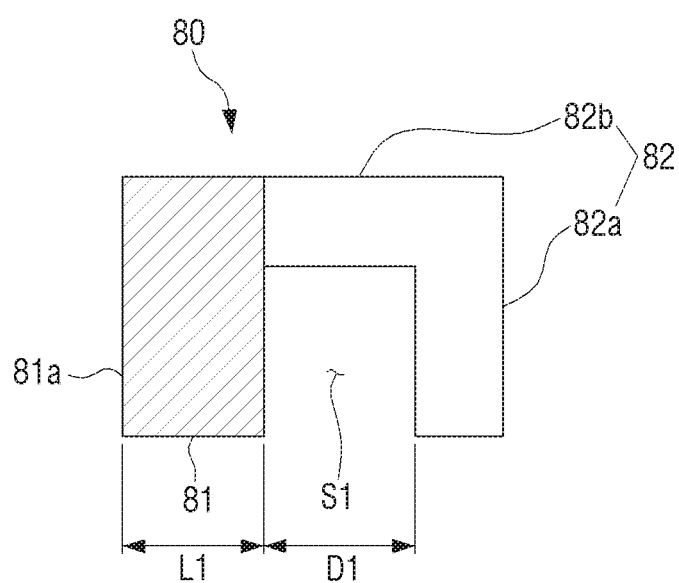
FIG. 3 is a sectional view illustrating a fixing member according to an embodiment.

FIG. 3 is a sectional view illustrating the fixing member 80 according to an embodiment.

The fixing member 80 may be disposed between the holder 30 and the light guide plate 40, and may be configured to connect the holder 30 and the light guide plate 40.

Specifically, the fixing member 80 may include a contraction member 81 that is disposed parallel to the light guide plate 40, and includes a negative thermal expansion (NTE) substance. Connection members 82 may be inserted in each of the plurality of connection holes H formed on the light guide plate 40, and may be configured to connect the light guide plate 40 and the contraction member 81.

However, as described above, the fixing member 80 is not limited to being connected with the light guide plate 40, and may be connected with at least one among the diffusion plate 20, the light guide plate 40, the reflective sheet 50, the prism sheet (not shown), the protective sheet (not shown), the double brightness enhancement film (DBEF) (not shown), and the color sheet (not shown).

That is, the fixing member 80 may be connected to the optical member 100 that is configured to guide light provided from the light source 70 to the display panel 10.

The contraction member 81 may include an NTE substance, and a surface 81a of the contraction member 81 may be affixed to the holder 30. Accordingly, even if the contraction member 81 contracts as the temperature increases, the contraction member 81 may contract while having directivity based on the surface 81a.

Here, the NTE substance may be substance which decreases in volume as the temperature rises. For example, the NTE substance may NiTi, FeNiCo, $ZrW_2O_8$, $ZrMo_2O_8$, $ZrV_2O_7$, $Cd(CN)_2$, $Ta_2O_5$—$WO_3$, $NaZr_2P_3O_{12}$, $HFW_2O_8$, $NbZrP_3O_{12}$, $BiNi_{0.82}Fe_{0.15}O_3$, etc.

In addition, the contraction member 81 may include an NTE substance, and may also be formed while being mixed with a substance such as epoxy.

Figure 8:
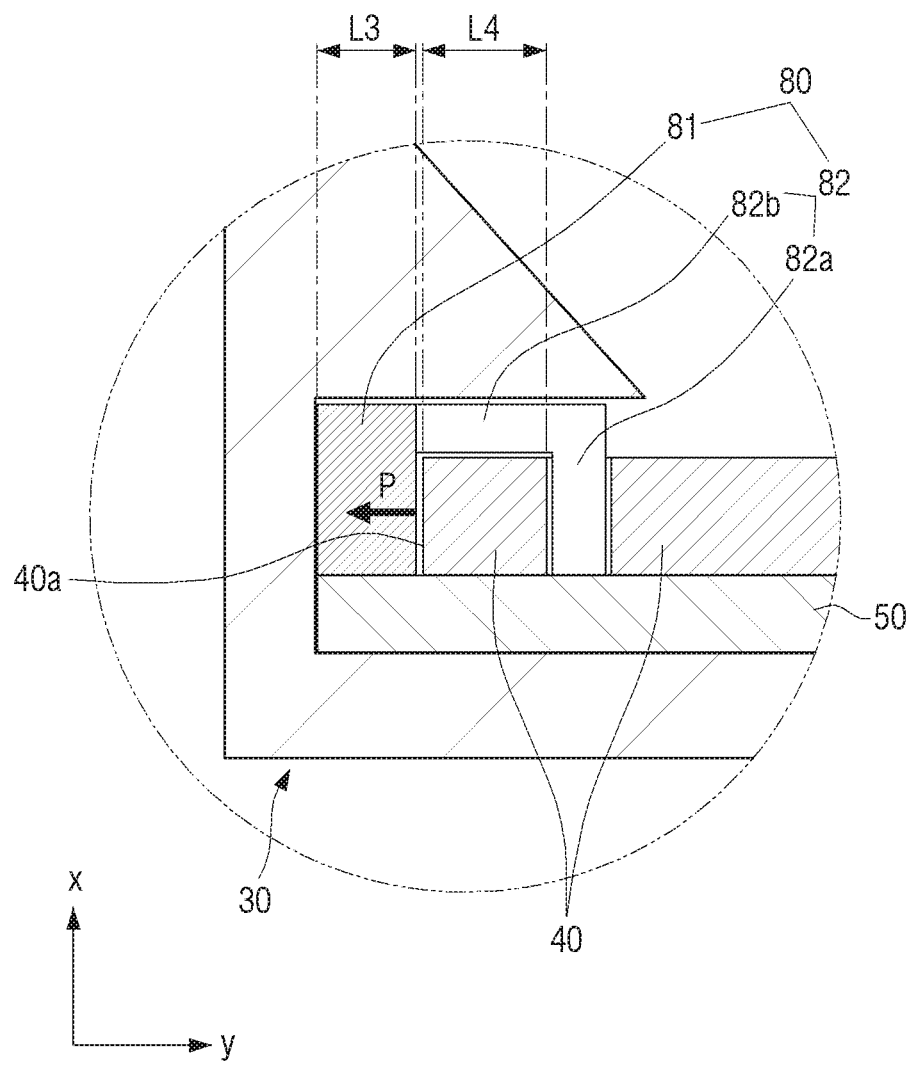
FIG. 8 is an enlarged view illustrating a state wherein the temperature rose in FIG. 7.

Also, the contraction member 81 may be formed to have a first length L1 from the surface 81a of the contraction member 81. Afterwards, and in situation where the temperature increases, the contraction member 81 contracts in the direction of the surface 81a of the contraction member 81 based on the surface 81a of the contraction member 81, and includes a third length L3 (e.g., as shown in FIG. 8) that is less than the first length L1 of the contraction member 81.

Figure 5:
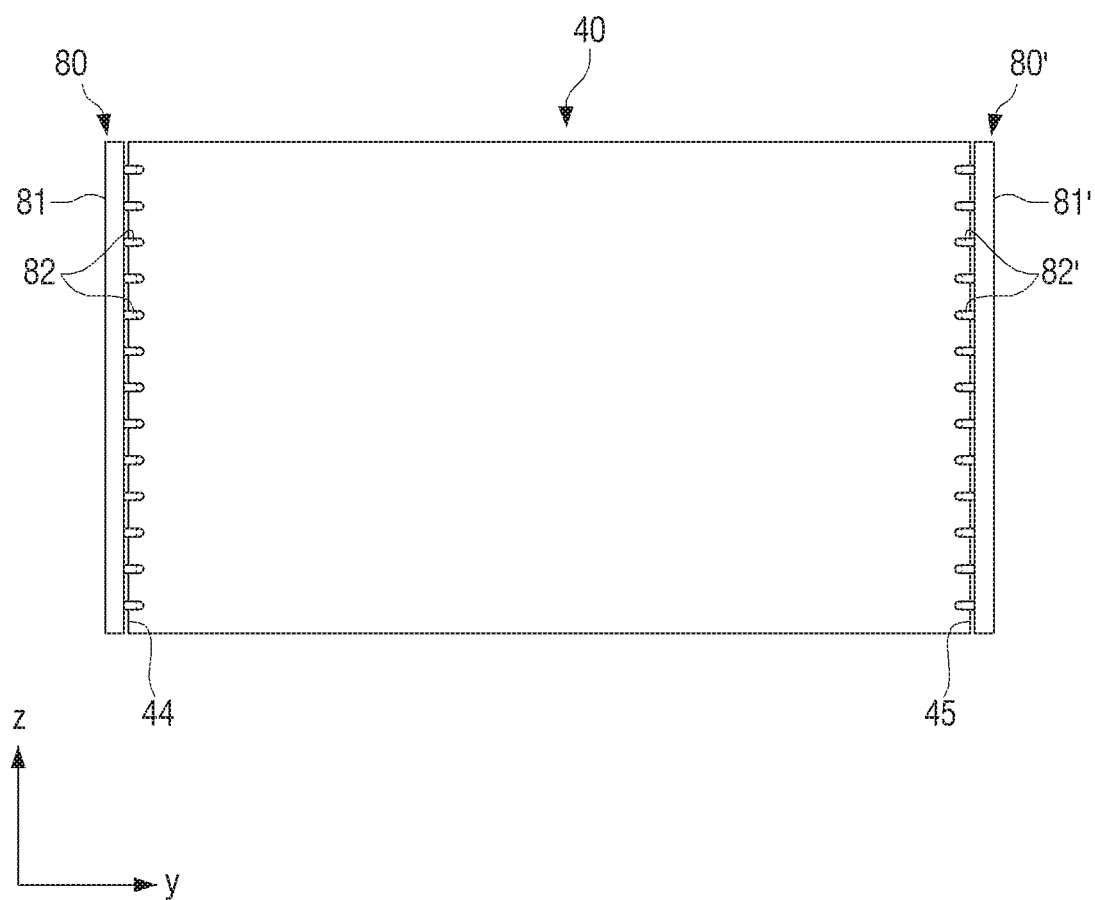
FIG. 5 is a front view illustrating an example wherein the optical member and the fixing member shown in FIG. 4 are combined.

Further, as shown in FIG. 5, the contraction member 81 may be disposed at a specific interval from a second side surface 44 along the second side surface 44 of the light guide plate 40. Here, the second side surface 44 may refer to a left side surface of the light guide plate 40.

The connection members 82 may be disposed between the contraction member 81 and the light guide plate 40, and may be configured to connect the contraction member 81 and the light guide plate 40.

Specifically, the connection members 82 may include a plurality of insertion parts 82a that are configured to be inserted into each of the plurality of connection holes H, and a plurality of connection parts 82b that are configured to connect the contraction member 81 and the plurality of insertion parts 82a.

Each of the plurality of insertion parts 82a may be inserted in each of the plurality of connection holes H, and thereby affixed. Accordingly, the cross section of each of the plurality of insertion parts 82a may correspond to the shape of each of the plurality of connection holes H. For example, in a case where the cross sections of the plurality of connection holes H are circular, the shapes of the plurality of insertion parts 82a may also be circular.

The number of the plurality of insertion parts 82a may be identical to the number of the plurality of connection holes H, and the plurality of insertion parts 82a may be disposed in locations corresponding to locations where the plurality of connection holes H are formed.

The plurality of connection parts 82b may extend from one end of each of the plurality of insertion parts 82a, and may be connected with the contraction member 81. Specifically, each of the plurality of connection parts 82b may extend from one end of each of the plurality of insertion parts 82a to the top surface 41 of the light guide plate 40, and may be connected with the contraction member 81 that is disposed parallel to the light guide plate 40.

In addition, the plurality of connection parts 82b may be formed such that the contraction member 81 and the plurality of insertion parts 82a are spaced apart from each other at a first interval D1. Accordingly, between the contraction member 81 and the plurality of insertion parts 82a, a space part S1 having a first interval D1 may be formed.

Figure 7:
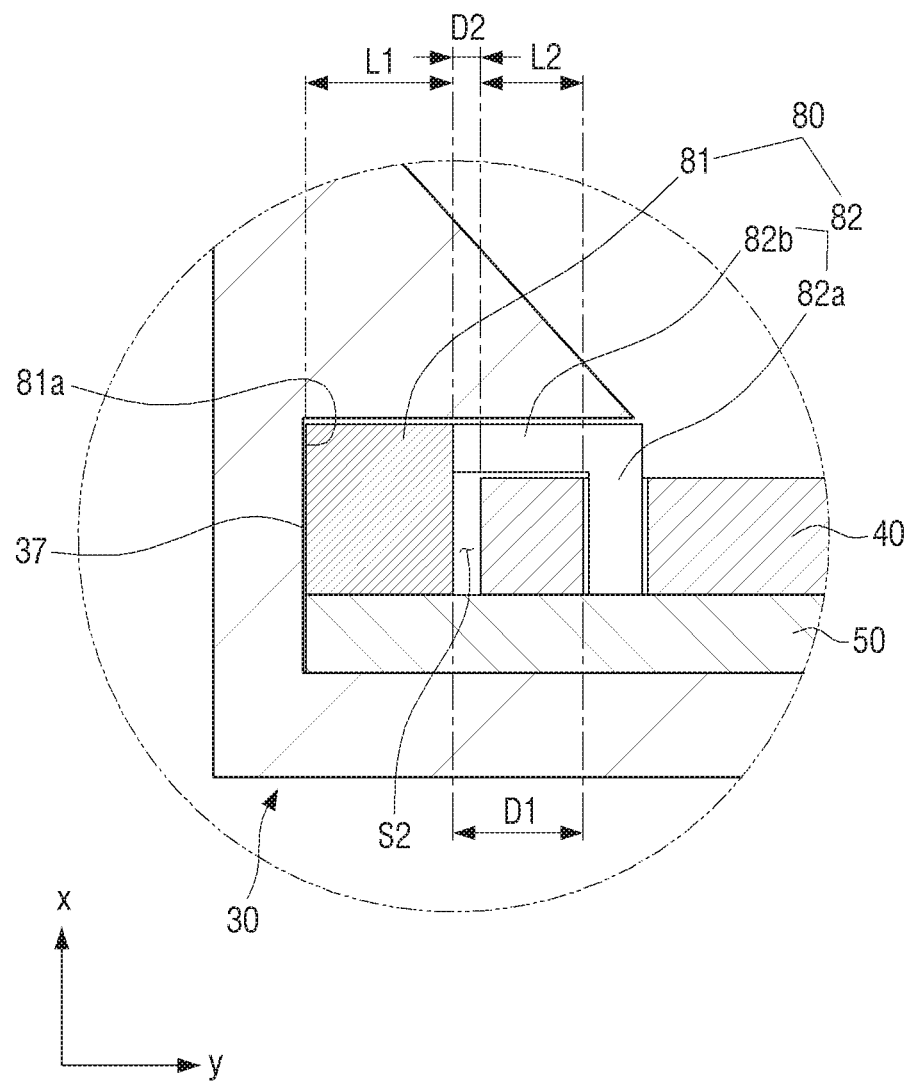
FIG. 7 is an enlarged view illustrating the B portion in FIG. 6.

Here, the space part S1 may be disposed while a portion of the light guide plate 40 is inserted, and a separation space S2 (e.g., as shown in FIG. 7) may be provided between the contraction member 81 and the light guide plate 40.

Further, as shown in FIG. 7, the first interval D1 may be identical to the sum of the second length L2 of the light guide plate 40 that is disposed in the space part S1 and the second interval D2 of the separation space S2 that is formed between the contraction member 81 and the light guide plate 40.

Also, each of the plurality of connection parts 82b and each of the plurality of insertion parts 82a may be integrally formed. For example, each of the plurality of insertion parts 82a and each of the plurality of connection parts 82b may be formed to include a shape shown as '¬.'

Accordingly, in a case where the contraction member 81 contracts in the direction of the surface 81a of the contraction member 81 as the temperature increases, the plurality of connection parts 82b and the plurality of insertion parts 82a that are connected with the contraction member 81 may move in a direction that corresponds to the contraction of the contraction member 81. Accordingly, the plurality of connection parts 82b and the plurality of insertion parts 82a may move or pull one side of the light guide plate 40 that is connected with the connection members 82 in the direction that corresponds to the contraction of the contraction member 81.

Also, the connection members 82 including the plurality of insertion parts 82a and the plurality of connection parts 82b may include a transparent material. Accordingly, light that is irradiated from the light source 70 may not be inhibited by the connection members 82, and thus uniform luminance of the display panel 10 can be implemented.

Hereinafter, the disposition and the combined structure of the light guide plate 40, the fixing member 80, and the additional fixing member 80' will be described with reference to FIGS. 4 and 5.

FIG. 4 is a front view illustrating a light guide plate 40 according to an embodiment, and FIG. 5 is a front view illustrating an example wherein the light guide plate 40 and the fixing member 80 shown in FIG. 4 are combined.

As shown in FIG. 4, the light guide plate 40 may include a first side surface 42 wherein the light source 70 is disposed along the longitudinal direction, a second side surface 44 wherein the fixing member 80 is disposed, a third side surface 45 wherein the additional fixing member 80' is disposed, and a fourth side surface 43.

Here, the additional fixing member 80' may be an identical component to the fixing member 80, and the contraction member 81 and the connection members 82 included in the fixing member 80 may be identical to the additional contraction member 81' and the additional connection members 82' included in the additional fixing member 80'.

Also, the plurality of connection holes H may be formed along the second side surface 44 and the third side surface 45 of the light guide plate 40. Accordingly, the fixing member 80 and the additional fixing member 80' may be respectively inserted in the plurality of connection holes H, and may be stably affixed to the second side surface 44 and the third side surface 45 of the light guide plate 40.

Here, the first side surface 42 may be a lower side surface of the light guide plate 40, the second side surface 44 may be a left side surface of the light guide plate 40, the third side surface 45 may be a right side surface of the light guide plate 40, and the fourth side surface 43 may be an upper side surface of the light guide plate 40. That is, the display apparatus 1 according to an embodiment of the disclosure may be an edge-type display apparatus.

In addition, the contraction member 81 may be disposed along the second side surface 44 of the light guide plate 40 that is different from the first side surface 42 of the light guide plate 40. Also, the additional contraction member 81' may be disposed on the third side surface 45 of the light guide plate 40 that opposes the second side surface 44.

Accordingly, through the structure of the light guide plate 40 wherein the contraction members 81 are disposed on both side surfaces, even if the temperature of the light guide plate 40 increases, the contraction members 81 may compensate or offset the volume expansion of the light guide plate 40 in the directions of the both side surfaces.

Also, considering that the length in the horizontal direction (e.g., the Y axis direction) of the light guide plate 40 is formed to be longer than the length in the vertical direction (e.g., the Z axis direction), a change in the volume of the light guide plate 40 based on the increase of the temperature may be greater in the horizontal direction of the light guide plate 40 than as compared to the vertical direction.

Accordingly, as the contraction member 81 and the additional contraction member 81' are respectively disposed on the left and right side surfaces of the light guide plate 40, a change in the volume of the light guide plate 40 may be effectively compensated or offset.

Hereinafter, with reference to FIGS. 6A through 8, the detailed structures and operations of the fixing member 80 and the additional fixing member 80' disclosed in an embodiment will be explained.

Figure 6B:
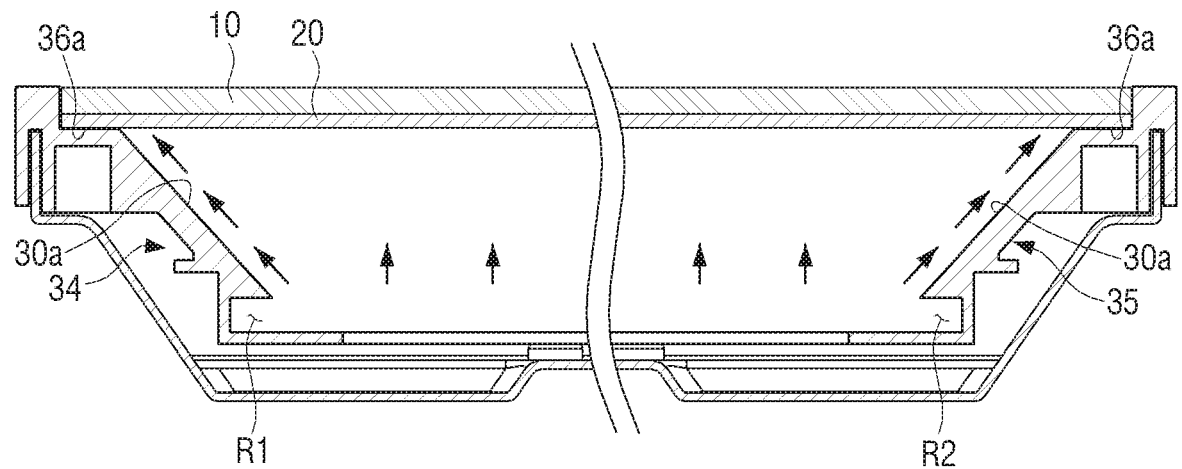
FIG. 6B is a sectional view illustrating an example wherein the fixing member, the optical member, and the reflection member are omitted in FIG. 6A.

FIG. 6A is a sectional view shown along the A-A line in FIG. 1, and FIG. 6B is a sectional view illustrating an example wherein the fixing member 80, the light guide plate 40, and the reflective sheet 50 are omitted in FIG. 6A. FIG. 7 is an enlarged view illustrating the B portion in FIG. 6, and FIG. 8 is an enlarged view illustrating a state wherein the temperature rose in FIG. 7.

As shown in FIGS. 6A and 7, the fixing member 80 including the contraction member 81 and the connection members 82 may be disposed side by side with the light guide plate 40 in a horizontal direction (e.g., the Y axis direction).

Specifically, the fixing member 80 may be disposed on the second side surface 44 of the light guide plate 40, and the additional fixing member 80' may be disposed on the third side surface 45 of the light guide plate 40.

The holder 30 may include a left side holder 34 supporting the left side portion of the light guide plate 40, and a right side holder 35 supporting the right side portion of the light guide plate 40. The contraction member 81 of the fixing member 80 may be accommodated in the left side holder 34, and the additional contraction member 81' of the additional fixing member 80' may be accommodated in the right side holder 35. Additionally, the holder 30 may include an upper side holder 33, and a lower side holder 32.

In addition, the inner side surface of the holder 30 may include an inclined surface 30a that is inclined at a specific angle at the corner contacting the top surface 41 of the light guide plate 40 in the direction of the corner of the display panel 10.

The holder 30 including the inclined surface 30a may include a material which is configured to reflect light. Accordingly, light that is diffused from the top surface 41 of the light guide plate 40 may be guided to the bottom surface (not shown) of the display panel 10 along the inclined surface 30a of the holder 30, and may be effectively diffused and scattered to the display panel 10.

Further, the inclined surface 30a may be formed as a curved surface. Accordingly, light diffused to the side of the display panel 10 may be guided and reflected in a specific direction, and the light may be effectively scanned in the direction of the display panel 10.

Also, as shown in FIG. 6B, an accommodation part R1 for supporting the fixing member 80, the light guide plate 40, the reflective sheet 50, etc. may be formed in the holder 30. Specifically, the contraction member 81 and the additional contraction member 81' of the fixing member 80 may be accommodated in the accommodation parts R1 and R2 of the holder 30, thereby stably affixing the fixing member 80 inside the holder 30.

For example, a first accommodation part R1 may be formed in the left side holder 34, and the contraction member 81 may be accommodated in the first accommodation part R1. Also, a second accommodation part R2 may be formed in the right side holder 35, and the additional contraction member 81' may be accommodated in the second accommodation part R2.

Accordingly, by fixing the fixing member 80 and the additional fixing member 80' via the accommodation parts R1 and R2, the holder 30 may not stably fix the fixing member 80 and the additional fixing member 80', and may also directly or indirectly fix the light guide plate 40 that is connected to the fixing member 80 and the additional fixing member 80', thereby improving the stability of the structure.

In addition, surface 81a of the contraction member 81 may be affixed on the fixing surface 37 of the holder 30. Here, the surface 81a of the contraction member 81 may be affixed on the fixing surface 37 by various methods such as an adhesive method using an adhesive, a coupling method using a coupling member (not shown), etc.

Hereinafter, detailed operations of the fixing member 80 according to an embodiment will be explained with reference to FIGS. 7 and 8.

As shown in FIG. 7, the light guide plate 40 may be disposed in a space part S1 having a first interval D1 formed between the contraction member 81 and the plurality of insertion parts 82a.

Here, the first interval D1 may be identical to the sum of the second length L2 of the light guide plate 40 disposed in the space part S1 and the second interval D2 of the separation space S2 between the contraction member 81 and the light guide plate 40.

In addition, even though the temperature changes, the first interval D1 may remain constant, but the second interval D2 may change.

In the state shown in FIG. 7, the temperature of the light guide plate 40 may increase based on heat generated from the light source 70, heat generated from a control part (not shown), an external temperature, or the like.

Accordingly, the volume of the light guide plate 40 may increase in the horizontal direction (e.g., the Y axis direction), and as shown in FIG. 8, the light guide plate 40 inserted in the space part S1 may include a fourth length L4 that is greater than a second length L2.

Here, a separation space S2 may be formed between the contraction member 81 and the light guide plate 40. Accordingly, even if the length of the light guide plate 40 inserted in the space part S1 becomes a fourth length L4, the side cross section 40a of the light guide plate 40 may not contact the contraction member 81.

Accordingly, the separation space S2 between the contraction member 81 and the light guide plate 40 may accommodate the change in the volume of the light guide plate 40 due to an increase of the temperature, and can thereby prevent distortion or bending of the light guide plate 40.

In addition, as the temperature rises, the contraction member 81 may contract in a direction P which is the direction of the surface 81a of the contraction member 81, and have a third length L3. Accordingly, the change in the contracting volume of the contraction member 81 may offset the change in the increasing volume of the light guide plate 40.

Accordingly, the contraction member 81 may accommodate the change in the volume of the light guide plate 40 due to an increase of the temperature, and can thereby additionally prevent distortion or bending of the light guide plate 40.

Here, the amount of change L1-L3 of the contraction member 81 according to the change of the temperature may be greater than the amount of change L4-L2 of the light guide plate 40 disposed in the space part S1.

In addition, even if the amount of change L1-L3 of the contraction member 81 according to the change of the temperature is less than the amount of change L4-L2 of the light guide plate 40 disposed in the space part S1, the separation space S2 is formed between the contraction member 81 and the light guide plate 40, and thus contact of the side cross section 40a of the light guide plate 40 with the contraction member 81 can be prevented.

Also, the display apparatus 1 according to an embodiment can reduce the risk of malfunction of the display apparatus 1 even in the event of an extreme variation of the temperature. Further, and in the case where a plurality of display apparatuses are combined and installed, risks of faulty-installation and malfunction due to changes of sizes and forms can be prevented.

Further, the manufacturing process can be simplified, and the manufacturing cost can also be reduced via the light guide plate 40, the holder 30, and the fixing member 80.

Hereinafter, the configurations and the operations of the optical member, the fixing member 180, and the additional fixing member 180' according to a modified embodiment will be explained with reference to FIG. 9.

Figure 9:
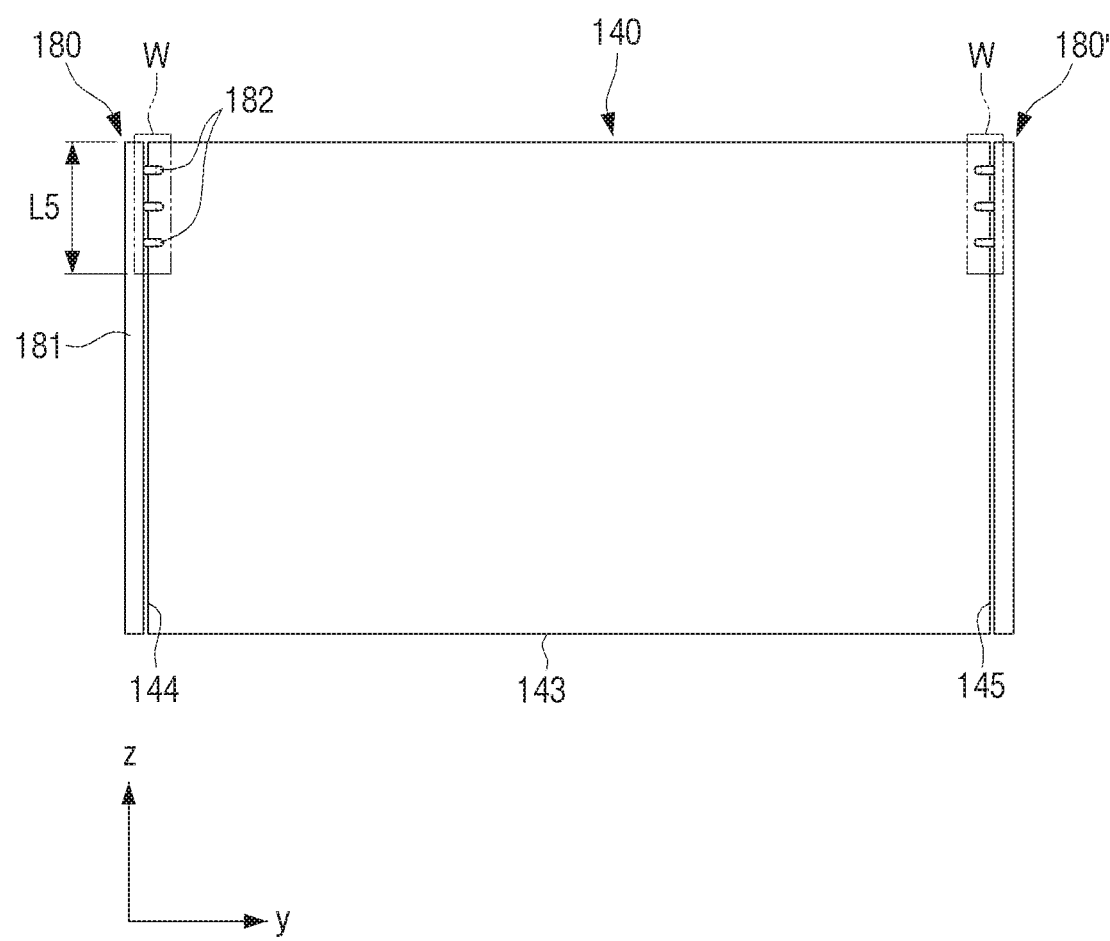
FIG. 9 is a front view illustrating an example wherein the optical member and the fixing member are combined according to a modified embodiment.

FIG. 9 is a front view illustrating an example wherein the optical member 100 and the fixing member 180 are combined according to a modified embodiment.

Here, the optical member 100 connected with the fixing member 180 may include various components that are configured to guide light provided from the light source 70 towards the display panel 10.

For example, the optical member 100 may include at least one among a diffusion plate 20, a light guide plate 140, a reflective sheet 50, a prism sheet (not shown), a protective sheet (not shown), a double brightness enhancement film (DBEF) (not shown), and a color sheet (not shown).

However, referring to FIG. 9, it will be described that the optical member 100 connected with the fixing member 180 is the light guide plate 140.

The light guide plate 140 may be substantially identical to the aforementioned light guide plate 40. However, and in contrast to the light guide plate 40, a plurality of connection holes H may be formed only in the upper area W of the light guide plate 140. Also, the fixing member 180 may include substantially the same configuration as that of the aforementioned fixing member 80. However, and in contrast to the fixing member 80, the connection members 182 inserted in the plurality of connection holes H may be formed only in the upper area W of the light guide plate 140.

In addition, the configuration of the additional fixing member 180' may be substantially identical to that of the fixing member 180, and thus duplicative explanation is omitted.

As shown in FIG. 9, the plurality of connection holes H may be formed in the upper area W of the second side surface 144 and the third side surface 145 of the light guide plate 140.

The length L5 of the upper area W may occupy greater than or equal to half of the length of the light guide plate 140 with respect to the vertical longitudinal direction Y of the light guide plate 140. For example, the plurality of connection holes H may be formed in the upper portion occupying an area greater than or equal to half of the length of the light guide plate 140 with respect to the length of the second side surface 144 and the third side surface 145.

Accordingly, in the case of an edge-type display apparatus wherein the light source 70 is disposed along the longitudinal direction of the first side surface 143 of the light guide plate 140, heat generated from the light source 70 is transmitted to the first side surface 143 of the light guide plate 140, and as it becomes far from the first side surface 143 in the vertical longitudinal direction (e.g., the Z axis direction), heat transmitted from the light source 70 decreases.

Accordingly, the increase of the volume of the light guide plate 140 in a portion close to the first side surface 143 of the light guide plate 140 is greater than the increase of the volume of the light guide plate 140 in a portion far from the first side surface 143 of the light guide plate 140. That is, with respect to the vertical longitudinal direction (the Z axis direction), the changed amount of the volume of the light guide plate 140 varies.

Here, in a case where a difference occurs between the increase of the volume of the light guide plate 140 in a portion close to the first side surface 143 of the light guide plate 140 and the increase of the volume of the light guide plate 140 in a portion far from the first side surface 143 of the light guide plate 140, the connection members 182 disposed in the upper area W of the fixing member 180 are configured to pull the upper area W of the light guide plate 140.

Accordingly, with respect to the difference between the increase of the volume of the light guide plate 140 in a portion close to the first side surface 143 of the light guide plate 140 and the increase of the volume of the light guide plate 140 in a portion far from the first side surface 143 of the light guide plate 140, the connection members 182 disposed in the upper area W of the fixing member 180 pull the upper area W of the light guide plate 140, and thus the overall increase rate of the light guide plate 140 can be corrected.

Also, in a case where a parallel bar (not shown) having a specific hardness is combined along the longitudinal direction of the contraction member 181, even if a portion of the contraction member 181 contracts, the entire contraction member 181 may contract.

In addition, by using the difference between the contraction rate of the contraction member 181 of the fixing member 180 and the expansion rate of the light guide plate 140, a configuration as described above can be implemented.

Hereinafter, an example of applying the aforementioned configuration to the direct-type display apparatus according to the disclosure will be explained with reference to FIG. 10.

Figure 10:
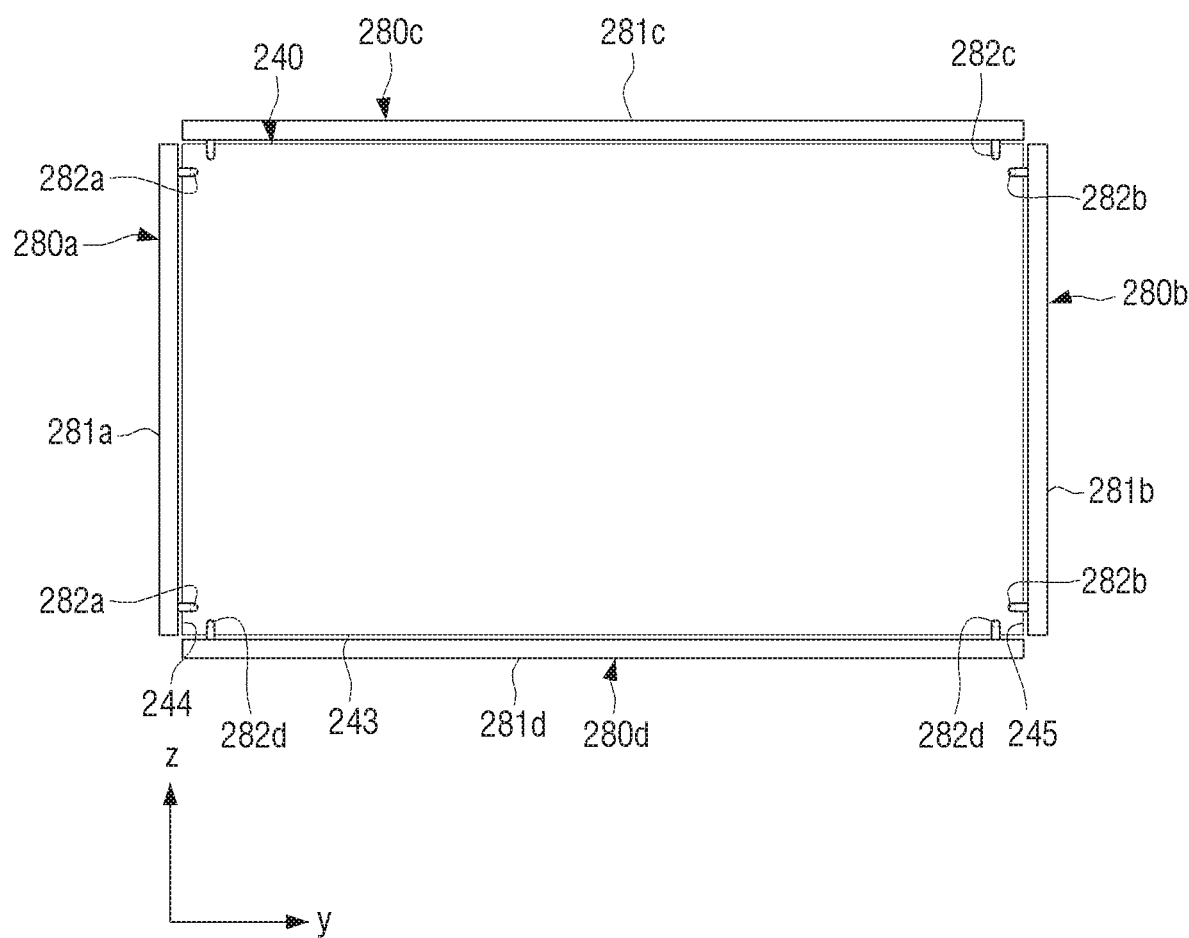
FIG. 10 is a front view illustrating an example wherein the optical member and the fixing member are combined according to another embodiment.

FIG. 10 is a front view illustrating an example wherein the optical member 240 and the fixing members 280*a* through 280*d* are combined according to another embodiment.

According to an embodiment, the light source 70 may be disposed behind the optical member 240. That is, an embodiment of the disclosure may be a direct-type display apparatus.

In addition, as a direct-type display apparatus, the optical member 240 may include at least one among a diffusion plate 20, a reflective sheet 50, a prism sheet (not shown), a protective sheet (not shown), a double brightness enhancement film (DBEF) (not shown), and a color sheet (not shown), or the like. As shown in FIG. 10, an embodiment includes multiple fixing members 280*a* through 280*d*. For example, the fixing members 280*a* through 280*d* may include a left side fixing member 280*a*, a right side fixing member 280*b*, an upper side fixing member 280*c*, and a lower side fixing member 280*d*, based on the optical member 240.

In addition, each of the fixing members 280*a* through 280*d* may include contraction members 281*a* through 281*d*, and connection members 282*a* through 282*d*. Accordingly, an embodiment includes multiple contraction members 281*a* through 281*d*. The contraction members 281*a* through 281*d* comprise a plurality of contraction members.

The plurality of contraction members 281*a* through 281*d* may be respectively disposed along the side surfaces of the optical member 240, and the connection members 282*a* through 282*d* may be disposed on the side surfaces of the optical member 240, and may be configured to connect the optical member 240 and the plurality of contraction members 281*a* through 281*d*.

Accordingly, in a case where the light source 70 is evenly disposed behind the optical member 240, the optical member 240 may transmit heat evenly throughout its front surface, and the volume of the optical member 240 may change evenly in the direction of the side surfaces of the optical member 240.

Here, as described above, the plurality of contraction members 281*a* through 281*d* contract as the temperature increases, and thus the plurality of contraction members 281*a* through 281*d* may offset or accommodate the change in the volume of the optical member 240.

Accordingly, the fixing members 280*a* through 280*d* may be applied to a direct-type display apparatus as well as an edge-type display apparatus.

So far, each of the various embodiments of the disclosure was separately explained. However, each of the embodiments does not have to be necessarily implemented independently, but may be implemented while the constitution and the operation of each embodiment are combined with those of at least one other embodiment.

Also, while embodiments of the disclosure have been shown and described, the disclosure is not limited to the aforementioned specific embodiments, and it should be apparent that various modifications can be made by those having ordinary skill in the art to which the disclosure belongs, without departing from the gist of the disclosure as claimed by the appended claims. In addition, it is intended that such modifications are not to be interpreted independently from the technical idea or prospect of the disclosure.

What is claimed is:

1. A display apparatus comprising:
   a display panel;
   an optical member that is disposed behind the display panel and that is configured to guide light to the display panel;
   a light source that is configured to irradiate light to the optical member;
   a holder that is configured to support the display panel and the optical member; and
   a contraction member that is disposed parallel to the optical member on a side surface of the optical member, and that comprises a negative thermal expansion (NTE) substance,
   wherein the optical member comprises a plurality of connection holes,
   wherein the display apparatus further includes connection members that are configured to be inserted in the plurality of connection holes, that are directly connected to the contraction member, and that connect the optical member and the contraction member, and
   wherein each connection member includes an insertion part that is configured to be inserted in a connection hole, and includes a connection part that is perpendicular to the insertion part, and that is configured to connect the contraction member and the insertion part.

2. The display apparatus of claim 1, wherein the plurality of connection holes are formed at predetermined intervals in a corner area of the optical member.

3. The display apparatus of claim 2, wherein:
   a surface of the contraction member is affixed to the holder.

4. The display apparatus of claim 3, wherein a separation space is formed between the contraction member and the optical member.

5. The display apparatus of claim 4, wherein:
   the optical member comprises a rectangular light guide plate,
   the light source is disposed along a first side surface of the optical member, and
   the contraction member is disposed along a second side surface of the optical member that is different from the first side surface.

6. The display apparatus of claim 5, further comprising:
   another contraction member that is disposed on a third side surface that opposes the second side surface.

7. The display apparatus of claim 6, wherein:
   the first side surface is a lower side surface of the optical member,
   the second side surface is a left side surface of the optical member, and
   the third side surface is a right side surface of the optical member.

8. The display apparatus of claim 7, wherein the holder comprises an accommodation part that is configured to accommodate the contraction member.

9. The display apparatus of claim 8, wherein:
   the holder comprises:
   a left side holder that is configured to support a left side portion of the optical member; and
   a right side holder that is configured to support a right side portion of the optical member,
   the contraction member is accommodated in the left side holder, and
   the other contraction member is accommodated in the right side holder.

10. The display apparatus of claim 6, wherein the plurality of connection holes are formed along the second side surface and the third side surface of the optical member.

11. The display apparatus of claim 10, wherein the plurality of connection holes are formed only in respective upper areas of the second side surface and the third side surface of the optical member.

12. The display apparatus of claim 4, wherein the optical member includes at least one of a light guide plate, a diffusion plate, a reflective sheet, a prism sheet, a protective sheet, a double brightness enhancement film (DBEF), and a color sheet.

13. The display apparatus of claim 4, wherein:
   the light source is disposed behind the optical member,
   the display apparatus comprises a plurality of contraction members, and
   the plurality of contraction members are respectively disposed along side surfaces of the optical member.

14. The display apparatus of claim 13, wherein the optical member includes at least one among a diffusion plate, a reflective sheet, a prism sheet, a protective sheet, a double brightness enhancement film (DBEF), and a color sheet.

15. The display apparatus of claim 2, wherein the connection members are comprised of a transparent material.

* * * * *